United States Patent [19]

Hsue et al.

[11] Patent Number: 5,427,970
[45] Date of Patent: Jun. 27, 1995

[54] METHOD OF MAKING FLASH MEMORY WITH HIGH COUPLING RATIO

[75] Inventors: Chen-Chih Hsue; Gary Hong, both of Hsin-Chu, Taiwan

[73] Assignee: United Microelectronics Corporation, Hsinchu, Taiwan

[21] Appl. No.: 276,604

[22] Filed: Jul. 18, 1994

[51] Int. Cl.$^6$ .................................... H01L 21/265
[52] U.S. Cl. .................................. 437/43; 437/52; 437/228; 437/984; 257/321
[58] Field of Search ............... 437/43, 228, 52, 984; 257/321

[56] References Cited

U.S. PATENT DOCUMENTS

| | | |
|---|---|---|
| 5,021,848 | 6/1991 | Chiu . |
| 5,155,055 | 10/1992 | Gill et al. ............................. 437/43 |
| 5,278,089 | 1/1994 | Nakagawara ........................ 437/52 |
| 5,310,693 | 5/1994 | Hsue ..................................... 437/43 |

OTHER PUBLICATIONS

"A Novel Sublithographic Tunnel Diode Based 5V-Only Flash Memory" by M. Gill et al, IEDM 90, ©1990 by IEEE pp. 119-122.
"A High Capacitive-Coupling Ratio (HiCR) Cell for 3V-Only 64 Mbit & Future Flash Memories", by Y. S. Hisamune et al, IEDM 93, ©1993 by IEEE, pp. 19-22.

Primary Examiner—Olik Chaudhuri
Assistant Examiner—Richard A. Booth
Attorney, Agent, or Firm—George O. Saile

[57] ABSTRACT

A new method of fabricating a high coupling ratio Flash EEPROM memory cell is achieved. A layer of silicon dioxide is provided over the surface of a semiconductor substrate. A layer of silicon nitride is deposited over the silicon dioxide layer and patterned. The silicon dioxide layer not covered by the patterned silicon nitride layer is removed, thereby exposing portions of the substrate. A tunnel oxide layer is grown on the exposed portions of the semiconductor substrate. Silicon nitride spacers are formed on the sidewalls of the patterned silicon nitride layer. Ions are implanted into the substrate using the silicon nitride layer and spacers as a mask to form implanted regions within the semiconductor substrate. The semiconductor substrate is oxidized where the implanted regions have been formed leaving the thin tunnel oxide only under the silicon nitride spacers. The silicon nitride layer and spacers are removed. A first polysilicon layer is deposited over the surface of the silicon dioxide and tunnel oxide layers and patterned to form a floating gate. An interpoly dielectric layer is deposited over the patterned first polysilicon layer followed by a second polysilicon layer. The second polysilicon layer is patterned to form a control gate. Passivation and metallization complete the fabrication of the memory cell with improved coupling ratio.

27 Claims, 3 Drawing Sheets

METHOD OF MAKING FLASH MEMORY WITH HIGH COUPLING RATIO

BACKGROUND OF THE INVENTION (1) Field of the Invention

The invention relates to a method of fabricating semiconductor memory devices employing floating gates, and more particularly, to a method of fabricating memory devices employing floating gates having improved coupling ratio.

(2) Description of the Prior Art

One class of semiconductor memory devices employ floating gates; that is, gates which are completely surrounded by an insulating layer, such as a silicon oxide. The presence or absence of charge in the floating gates represents binary information. These are called electrically programmable read only memories (EPROM). EEPROMS are erasable electrically programmable read only memories. "Flash" memory devices, are those in which all of the cells can be erased in a single operation.

A typical high coupling ratio Flash EEPROM of the prior art, such as that described in the paper, "A High Capacitive-Coupling Ratio (HiCR) Cell for 3 V-Only 64 Mbit and Future Flash Memories," by Y. S. Hisamune et al, IEDM 93, c. 1993 by IEEE, pp. 19–22, is illustrated in FIG. 1. Gate oxide layer 42 has been grown on the surface of a semiconductor substrate 10. The tunneling oxide 46, necessary for the erase function of the cell, is grown on either side of the gate oxide layer 42 surrounding the first polysilicon layer 48. The polysilicon layer 48 is sidewall oxidized with additional tunneling oxide 50. A second polysilicon deposition is used to form spacers 52. A third polysilicon layer 54 connects the first polysilicon layer 48 and the polysilicon spacers 52 to form the floating gate of the memory cell. Interpoly dielectric layer 56 and the control gate 58 consisting of a fourth polysilicon layer complete the memory cell structure. Source and drain regions 60 are shown on either side of the gate structure. This memory cell is fabricated by a complicated process using four layers of polysilicon, an oxide/nitride capping layer, a sidewall oxidation, and two sidewall spacer etchbacks. The step height is triple polysilicon.

The paper, "A Novel Sublithographic Tunnel Diode Based 5V-Only Flash Memory," by M. Gill et al, IEDM 90, 1990 by IEEE, pp. 119–122, describes a memory cell having a remote tunnel diode. U.S. Pat. No. 5,278,089 to Nakagawara describes a NOR type read-only memory (ROM).

SUMMARY OF THE INVENTION

A principal object of the present invention is to provide an effective and very manufacturable method of fabricating a flash EEPROM memory cell.

Another object of the present invention is to provide an effective and very manufacturable method of fabricating a high coupling ratio flash EEPROM memory cell.

In accordance with the objects of this invention a new method of fabricating a high coupling ratio Flash EEPROM memory cell is achieved. Field oxide regions are provided in and on a semiconductor substrate. A layer of silicon dioxide is provided over the surface of the semiconductor substrate. A layer of silicon nitride is deposited over the silicon dioxide layer and patterned. The silicon dioxide layer not covered by the patterned silicon nitride layer is removed, thereby exposing portions of the semiconductor substrate. A tunnel oxide layer is grown on the exposed portions of the semiconductor substrate. Silicon nitride spacers are formed on the sidewalls of the patterned silicon nitride layer. Ions are implanted into the substrate using the silicon nitride spacers and the patterned silicon nitride layer as a mask to form implanted regions within the semiconductor substrate. The semiconductor substrate is oxidized where the implanted regions have been formed leaving the thin tunnel oxide only under the silicon nitride spacers. The silicon nitride layer and spacers are removed. A first polysilicon layer is deposited over the surface of the silicon dioxide and tunnel oxide layers and patterned to form a floating gate. An interpoly dielectric layer is deposited over the patterned first polysilicon layer followed by a second polysilicon layer. The second polysilicon layer is patterned to form a control gate. Passivation and metallization complete the fabrication of the memory cell with improved coupling ratio.

BRIEF DESCRIPTION OF THE DRAWINGS

In the accompanying drawings forming a material part of this description, there is shown.

DESCRIPTION OF THE PREFERRED EMBODIMENTS

Figure 1:
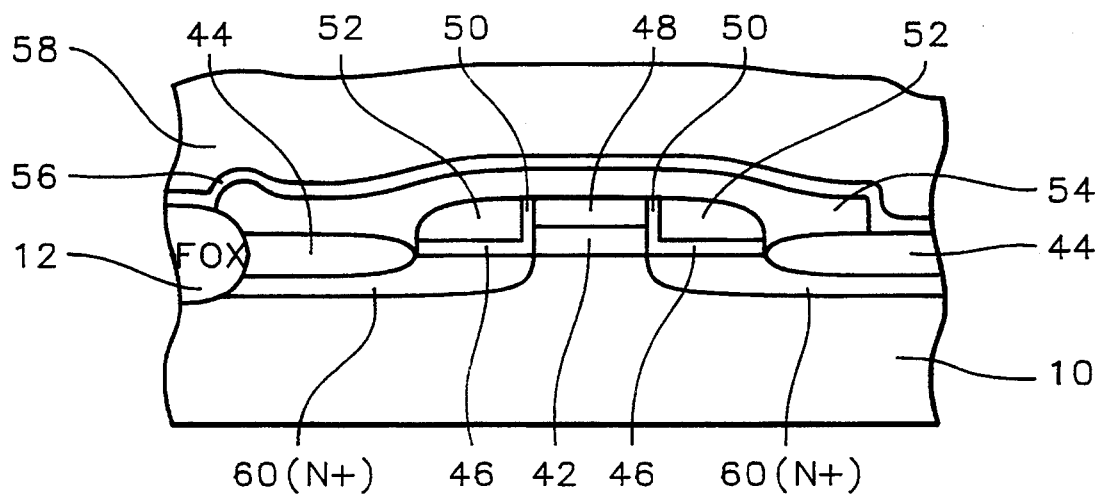
FIG. 1 schematically illustrates in cross-sectional representation a memory cell of the prior art.
Figure 2:
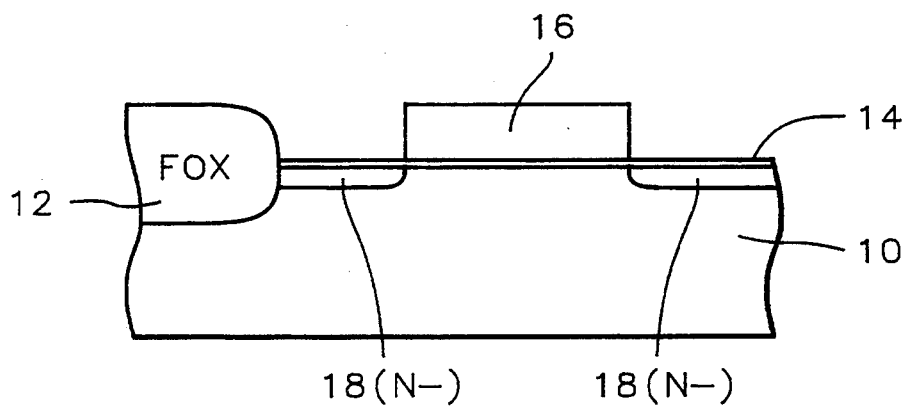
FIGS. 2 through 5 schematically illustrate in cross-sectional representation one preferred embodiment of the present invention.

Referring to FIGS. 2 through 5, the first preferred embodiment of the present invention will be described. Referring now more particularly to FIG. 2, the process of the present invention will be described. A portion of a partially completed memory cell is illustrated in FIG. 2 consisting of a semiconductor substrate 10, preferably composed of monocrystalline silicon. A local oxidation of silicon (LOCOS) process is performed to provide device isolation regions 12. A layer of silicon dioxide 14 is grown over the surfaces of the semiconductor substrate to a thickness of between about 150 to 500 Angstroms. A layer of silicon nitride 16 is deposited over the silicon dioxide layer to a thickness of between about 1000 to 2000 Angstroms and is patterned to cover the major channel region of the planned memory cell.

An optional lightly doped drain ion implantation is made into the substrate not covered by the patterned silicon nitride layer 16 to form lightly doped drain regions 18. This is typically an implantation of phosphorus ions with a dosage of between about 1 E 13 to 5 E 13 atoms/cm$^2$ at a energy of between about 40 to 80 KeV.

Figure 3:
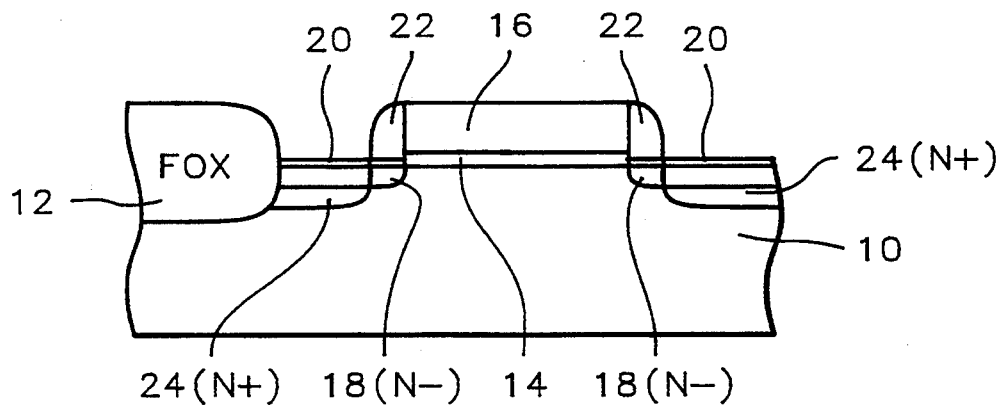

Referring now to FIG. 3, the substrate is dipped into a dilute hydrofluoric acid solution to remove the silicon dioxide layer 14 not covered by the silicon nitride layer 16, exposing portions of the silicon substrate. A thin tunneling oxide 20 is grown on the exposed silicon substrate surfaces to a thickness of between about 70 to 110 Angstroms.

A second layer of silicon nitride is deposited over the surfaces of the substrate and anisotropically etched away leaving silicon nitride spacers 22 on the sidewalls of the patterned silicon nitride layer 16. The spacers are between about 500 to 2000 Angstroms in width. The spacers will protect the underlying thin tunneling oxide 20.

Arsenic ions are implanted into the substrate using the silicon nitride layer 16 and the silicon nitride spacers 22 as a mask to form N+ implanted regions 24 which will act as source and drain regions. The ions are implanted with a dosage of between about 3 E 15 to 8 E 15 atoms/$cm^2$ at a energy of between about 60 to 100 KeV.

Figure 4:
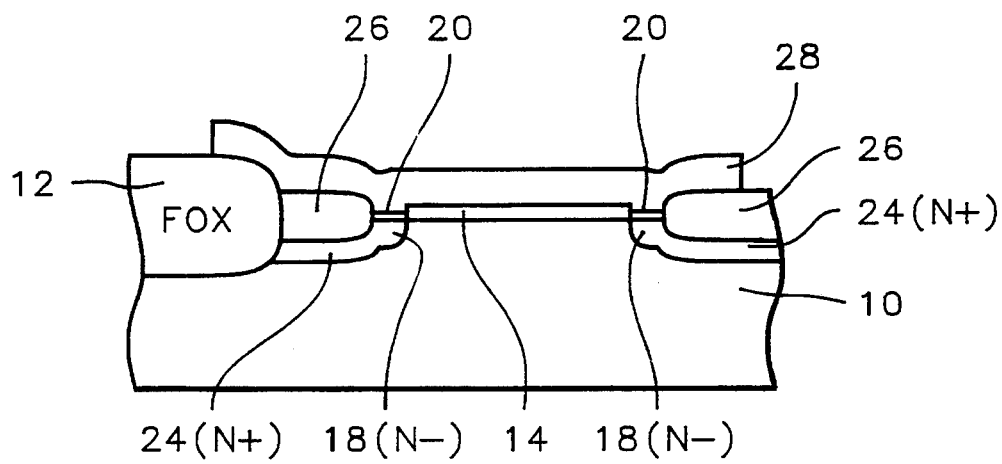

Referring now to FIG. 4, the N+ implanted regions are oxidized to form silicon dioxide regions 26 with a thickness of between about 500 to 1500 Angstroms. The thin tunnel oxide 20 underlying the silicon nitride spacers 22 remains while all other tunneling oxide is incorporated into the silicon dioxide regions 26. The small controllable areas of tunnel oxide 20 provide the improved coupling ratio and the improved short channel effect of the memory cell.

The silicon nitride layer 16 and spacers 22 are removed, typically by a dilute hydrofluoric acid dip followed by a hot phosphoric acid strip. A layer of polysilicon 28 is deposited over the surface of the substrate to a thickness of between about 1000 to 3000 Angstroms, doped, and etched to form the floating gate 28.

Figure 5:
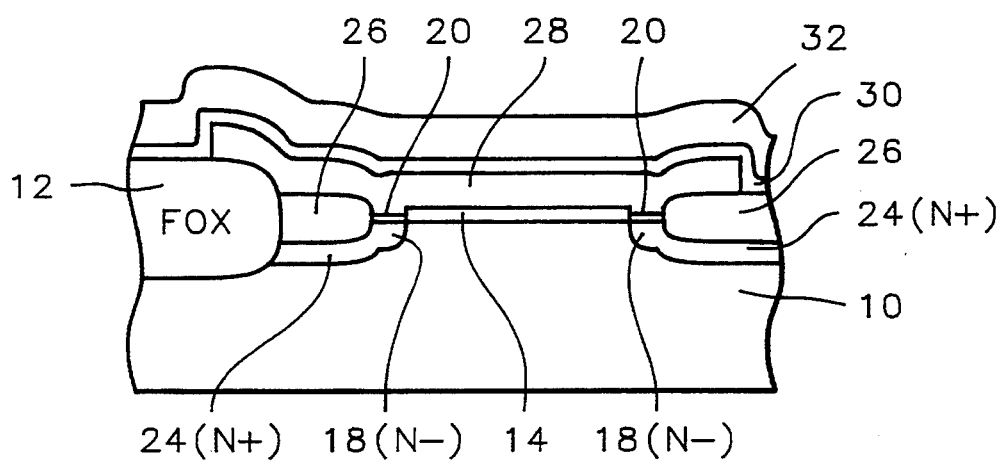

Referring now to FIG. 5, an interpoly dielectric 30, such as ONO (silicon oxide-silicon nitride-silicon oxide) is deposited over the polysilicon layer 28. A second polysilicon layer 32 is deposited over the dielectric 30 to a thickness of between about 2000 to 5000 Angstroms and doped. The second polysilicon layer is etched to form the control gate 32 of the memory cell. This second polysilicon layer 32 could alternatively be a polycide layer, such as tungsten silicide, molybdenum silicide, tantalum silicide, or titanium silicide.

Figure 6:
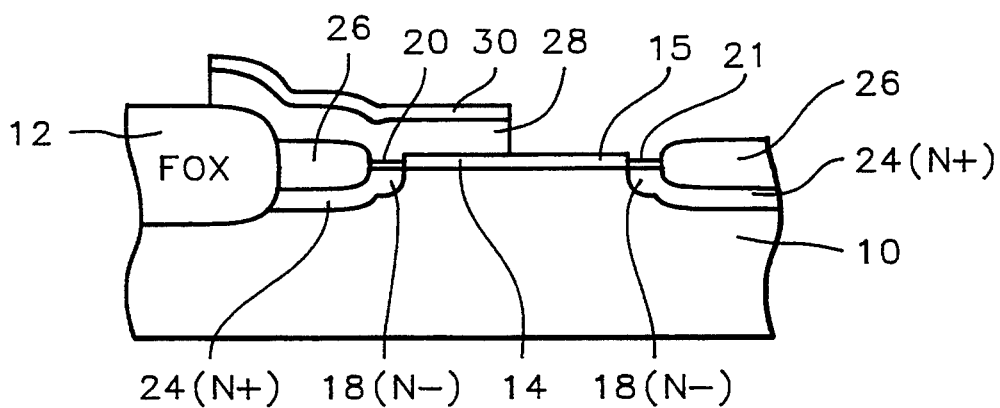
FIGS. 6 and 7 schematically illustrate in cross-sectional representation a second preferred embodiment of the present invention.
Figure 7:
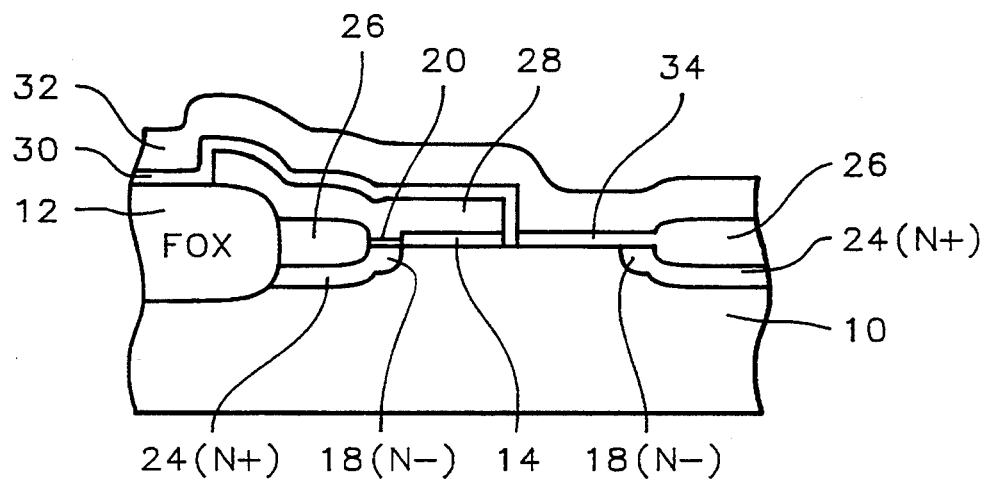

FIGS. 6 and 7 illustrate a second preferred embodiment of the present invention. The process proceeds as for the first embodiment through the steps illustrated in FIG. 3 and through the removal of the silicon nitride layer and spacers. In this embodiment, the first polysilicon layer 28 is deposited over the surface of the substrate and doped, as above. However, the interpoly dielectric layer 30 is deposited before the polysilicon layer is etched. The polysilicon layer 28 and the interpoly dielectric layer 30 are etched to form the floating gate. In this embodiment, the floating gate only partially overlaps the channel area, as shown in FIG. 6. The portion of the silicon dioxide layer 14 labeled 15 is not covered by the floating gate. The tunneling oxide 21 also is left uncovered.

Referring now to FIG. 7, the exposed silicon dioxide 15 and tunneling oxide 21 are removed by dipping the substrate into dilute hydrofluoric acid, thereby exposing the underlying silicon substrate. The exposed silicon is oxidized to form silicon dioxide region 34. The second polysilicon or polycide layer 32 is deposited to a thickness of between about 2000 to 5000 Angstroms, doped, and patterned to form the control gate of the memory cell.

Figure 8:
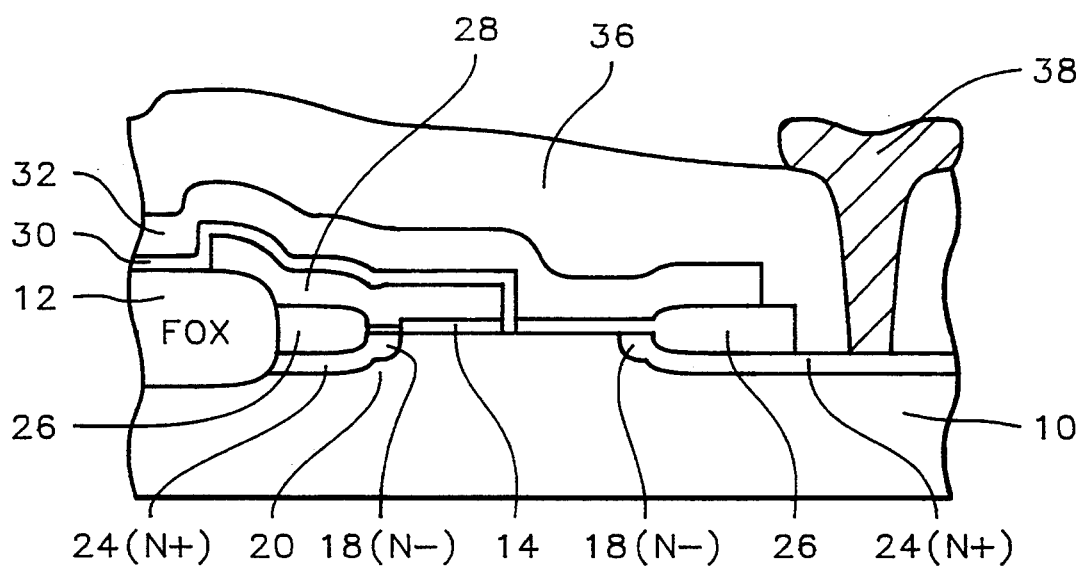
FIG. 8 schematically illustrates in cross-sectional representation a completed memory cell of the present invention.

Back-end processing continues as is conventional in the are for both the first and second preferred embodiments. As illustrated in FIG. 8 for the second embodiment, a dielectric layer 36 such as borophosphosilicate glass (BPSG), is deposited over the surface of the substrate. Contact openings are etched through the dielectric layer to expose the drain regions 24 where contact is desired. Metal layer 38, typically aluminum, is deposited and patterned to complete the contacts.

The advantages of the present invention are a less complex process than the prior art with only one sidewall spacer etchback and two polysilicon layers rather than four, resulting in a smaller step height.

While the invention has been particularly shown and described with reference to the preferred embodiments thereof, it will be understood by those skilled in the art that various changes in form and details may be made without departing from the spirit and scope of the invention.

What is claimed is:

1. The method of forming a memory cell with improved coupling ratio comprising:

depositing a layer of silicon nitride over the surface of a semiconductor substrate and patterning said silicon nitride layer to expose portions of said semiconductor substrate;

growing a tunnel oxide layer on said exposed portions of said semiconductor substrate;

forming silicon nitride spacers on the sidewalls of said patterned silicon nitride layer;

implanting ions into said substrate using said silicon nitride spacers and said patterned silicon nitride layer as a mask to form implanted regions within said semiconductor substrate;

oxidizing said semiconductor substrate where said implanted regions have been formed leaving said tunnel oxide only under said silicon nitride spacers;

removing said silicon nitride spacers and said silicon nitride layer;

depositing a first polysilicon layer over the surface of said semiconductor substrate and said tunnel oxide layer and patterning said first polysilicon layer to form a floating gate;

depositing an interpoly dielectric layer over said patterned first polysilicon layer;

depositing a second conducting layer overlying said dielectric layer and patterning said second conducting layer to form a control gate; and providing passivation and metallization to complete the fabrication of said memory cell with improved coupling ratio.

2. The method of claim 1 wherein said silicon nitride layer has a thickness of between about 1000 to 2000 Angstroms.

3. The method of claim 1 wherein after said silicon nitride layer has been patterned, a lightly doped drain implant is performed with phosphorus ions with a dosage of between about 1 E 13 to 5 E 13 atoms/$cm^2$ and energy of between about 40 to 80 KeV using said patterned silicon nitride layer as a mask.

4. The method of claim 1 wherein a layer of silicon dioxide is grown to a thickness of between about 150 to 500 Angstroms over the surface of said semiconductor substrate before the deposition of said silicon nitride layer.

5. The method of claim 1 wherein said tunnel oxide is grown to a thickness of between about 70 to 110 Angstroms.

6. The method of claim 1 wherein said silicon nitride spacers have a width of between about 500 to 2000 Angstroms.

7. The method of claim 1 wherein said implanted regions are formed by implanting Arsenic ions with a dosage of 3 E 15 to 8 E 15 atoms/cm$^2$ and energy of between about 60 to 100 KeV.

8. The method of claim 1 wherein said oxidizing said semiconductor substrate where said implanted regions have been formed results in oxidized regions having a thickness of between about 500 to 1500 Angstroms.

9. The method of claim 1 wherein said first polysilicon layer is deposited to a thickness of between about 1000 to 3000 Angstroms.

10. The method of claim 1 wherein said interpoly dielectric layer is composed of silicon nitride, silicon oxide, and silicon nitride (ONO) layers with a combined thickness of between about 150 to 500 Angstroms.

11. The method of claim 1 wherein said interpoly dielectric layer is deposited over said first polysilicon layer before said patterning of said first polysilicon layer and wherein said first polysilicon layer and said interpoly dielectric layer are patterned together.

12. The method of claim 1 wherein said second conducting layer is composed of polysilicon and is deposited to a thickness of between about 2000 to 5000 Angstroms.

13. The method of claim 1 wherein said second conducting layer is composed of a polycide material in the group consisting of tungsten silicide, molybdenum silicide, titanium silicide, and tantalum silicide and is deposited to a thickness of between about 2000 to 5000 Angstroms.

14. The method of forming a memory cell with improved coupling ratio comprising:
providing a layer of silicon dioxide over the surface of a semiconductor substrate;
depositing a layer of silicon nitride over said silicon dioxide layer and patterning said silicon nitride layer;
removing said silicon dioxide layer not covered by said patterned silicon nitride layer wherein portions of said semiconductor substrate are exposed;
growing a tunnel oxide layer on said exposed portions of said semiconductor substrate;
forming silicon nitride spacers on the sidewalls of said patterned silicon nitride layer;
implanting ions into said substrate using said silicon nitride spacers and said patterned silicon nitride layer as a mask to form implanted regions within said semiconductor substrate;
oxidizing said semiconductor substrate where said implanted regions have been formed leaving said tunnel oxide only under said silicon nitride spacers;
removing said silicon nitride spacers and said silicon nitride layer;
depositing a first polysilicon layer over the surface of said silicon dioxide and said tunnel oxide layers;
depositing an interpoly dielectric layer over said first polysilicon layer;
patterning said first polysilicon layer and said interpoly dielectric layer to form a floating gate wherein a portion of said silicon dioxide layer is exposed;
removing said exposed silicon dioxide layer wherein a portion of said semiconductor substrate is exposed;
oxidizing said exposed semiconductor substrate;
depositing a second conducting layer overlying said dielectric layer and said oxidized portion of said semiconductor substrate and patterning said second conducting layer to form a control gate; and
providing passivation and metallization to complete the fabrication of said memory cell with improved coupling ratio.

15. The method of claim 14 wherein said silicon nitride layer has a thickness of between about 1000 to 2000 Angstroms.

16. The method of claim 14 wherein after said silicon nitride layer has been patterned, a lightly doped drain implant is performed with phosphorus ions with a dosage of between about 1 E 13 to 5 E 13 atoms/cm$^2$ and energy of between about 40 to 80 KeV using said patterned silicon nitride layer as a mask.

17. The method of claim 14 wherein said silicon dioxide layer is grown to a thickness of between about 150 to 500 Angstroms.

18. The method of claim 14 wherein said tunnel oxide is grown to a thickness of between about 70 to 110 Angstroms.

19. The method of claim 14 wherein said silicon nitride spacers have a width of between about 500 to 2000 Angstroms.

20. The method of claim 14 wherein said implanted regions are formed by implanting Arsenic ions with a dosage of 3 E 15 to 8 E 15 atoms/cm$^2$ and energy of between about 60 to 100 KeV.

21. The method of claim 14 wherein said oxidizing said semiconductor substrate where said implanted regions have been formed results in oxidized regions having a thickness of between about 500 to 1500 Angstroms.

22. The method of claim 14 wherein said first polysilicon layer is deposited to a thickness of between about 1000 to 3000 Angstroms.

23. The method of claim 14 wherein said interpoly dielectric layer is composed of silicon nitride, silicon oxide, and silicon nitride (ONO) layers.

24. The method of claim 14 wherein said first polysilicon layer is patterned before the deposition of said interpoly dielectric layer.

25. The method of claim 14 wherein said oxidizing said semiconductor substrate before said second polysilicon deposition results in oxidized regions having a thickness of between about 200 to 500 Angstroms.

26. The method of claim 14 wherein said second conducting layer is composed of polysilicon deposited to a thickness of between about 2000 to 5000 Angstroms.

27. The method of claim 14 wherein said second conducting layer is composed of a polycide material in the group consisting of tungsten silicide, molybdenum silicide, titanium silicide, and tantalum silicide and is deposited to a thickness of between about 2000 to 5000 Angstroms.

* * * * *